United States Patent [19]

Renken et al.

[11] Patent Number: 4,647,133
[45] Date of Patent: Mar. 3, 1987

[54] ELECTRICAL INTERCONNECT SYSTEM

[75] Inventors: Wayne G. Renken, San Jose; Douglas W. Heigel, Novato; Ronald G. Payne, Fremont, all of Calif.

[73] Assignee: Innovus, Fremont, Calif.

[21] Appl. No.: 724,743

[22] Filed: Apr. 18, 1985

[51] Int. Cl.[4] .............................................. H01R 11/20
[52] U.S. Cl. ............................ 339/97 R; 339/278 C; 339/17 E; 339/17 F; 29/860
[58] Field of Search ............... 29/857, 860; 339/17 B, 339/17 CF, 17 F, 17 E, 17 T, 97 R, 97 P, 98, 99 R, 278 A, 278 C, 278 D, 278 M, 278 T, 275, 176 MF

[56] References Cited

U.S. PATENT DOCUMENTS

| | | | |
|---|---|---|---|
| 3,375,323 | 3/1968 | Mayhew | 339/17 E |
| 3,389,461 | 6/1968 | Hardardt | 339/17 E |
| 3,461,552 | 8/1969 | Wolf et al. | 339/17 B |
| 3,522,652 | 8/1969 | Gordon | 339/17 F |
| 3,573,345 | 4/1971 | Devries et al. | 339/17 B |
| 3,697,925 | 10/1972 | Henschen | 339/17 F |
| 3,818,415 | 6/1974 | Evans et al. | 339/278 C |
| 4,030,799 | 6/1977 | Vanaleck | 339/278 C |
| 4,260,212 | 4/1981 | Ritchie et al. | 339/97 R |
| 4,348,263 | 9/1982 | Draper et al. | 339/278 C |
| 4,417,097 | 11/1983 | Das | 339/278 C |
| 4,429,349 | 1/1984 | Zachry | 29/857 |
| 4,458,969 | 7/1984 | Demeo | 339/278 C |

*Primary Examiner*—Gil Weidenfeld
*Assistant Examiner*—Paula A. Austin
*Attorney, Agent, or Firm*—Thomas S. MacDonald; Alan H. MacPherson; Steven F. Caserza

[57] ABSTRACT

A corrosion resistant electrical interconnect system has a flexible circuit with buried conductor patterns in an insulative film coating which is juxtaposed to a feedthrough connector having inlet/outlet electrical contact pins therethrough. Sharp ends are present on the pins which pierce the insulative film and permit spot welding of the pin tips to portions of the conductor pattern. Other portions of the conductor pattern extend exteriorly of the flexible circuit and are electrically connected on to bond pads of an integrated circuit chip such as a sensor chip utilized in a mass flow meter.

13 Claims, 14 Drawing Figures

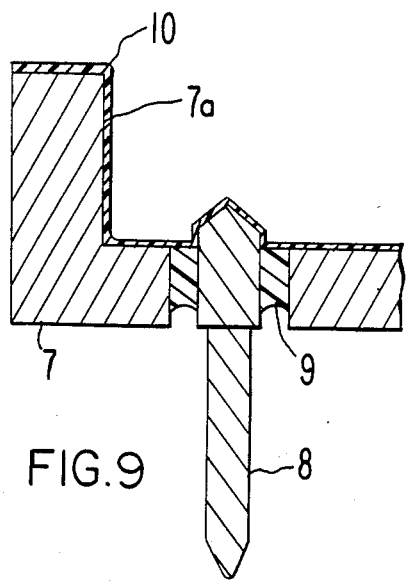
FIG.9
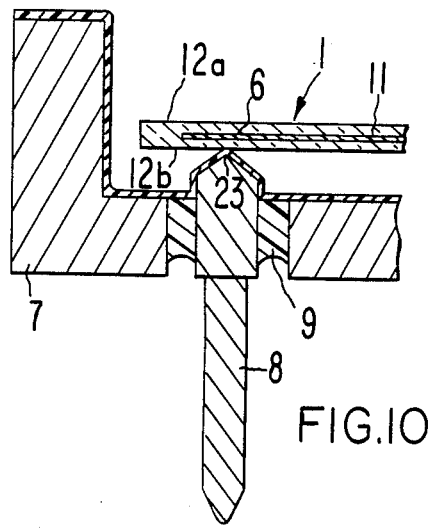
FIG.10
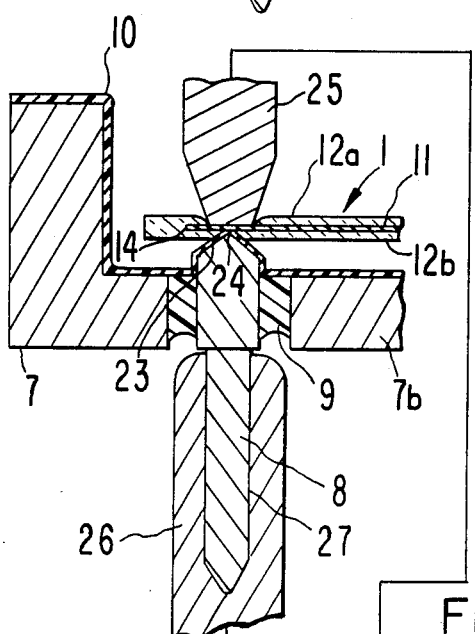
FIG.11
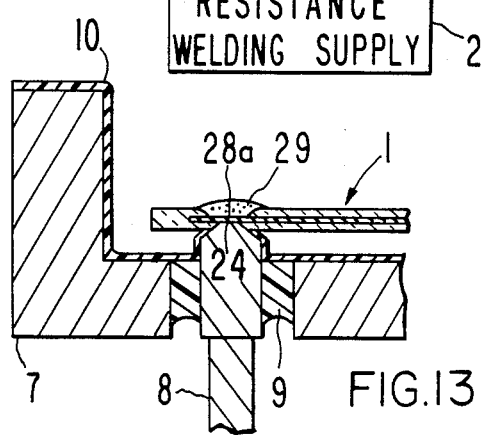
FIG.13
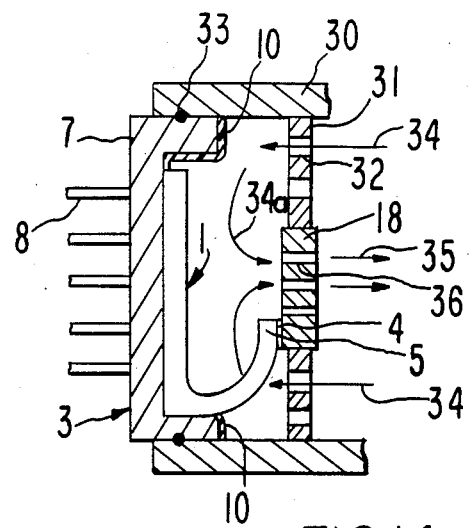
FIG.12
FIG.14

4,647,133

ELECTRICAL INTERCONNECT SYSTEM

CROSS-REFERENCE TO RELATED APPLICATIONS

This invention is related to U.S. applications Ser. No. 526,860, entitled "Thermal Mass Flow Meter", filed Aug. 26, 1983 by Renken/LeMay and Ser. No. 06/721,535 entitled "Thermal Mass Flowmeter and Controller", filed Apr. 10, 1985 by Renken/LeMay/Takahashi, both applications having a common assignee. The subject matter of such applications is incorporated herein by reference.

BACKGROUND OF THE INVENTION

1. Field of the Invention

This invention relates to chemically inert, electrical chip-to-inlet/outlet pins interconnect system for use in conducting electrical power and signals through a chemically reactive or corrosive environment, comprising primarily of reactive gases and fluids.

The invention particularly finds utility for interconnections, in a fluid mass flow sensor immersed in a corrosive fluid stream, to external circuits through electrical feed through connections in the wall of a flow conduit.

2. Description of the Prior Art

Prior art includes flexible printed circuits which are widely available, Teflon insulated wire, and Teflon insulated, flexible, etched foil heating elements of the type produced by MINCO PRODUCTS, INC. of Minneapolis, Minn.

SUMMARY

The corrosion resistant interconnect system of this invention comprises a construction and method for conducting electrical power and signals through a corrosive media without degradation of the interconnect systems signal transmission properties, or contamination of the corrosive media. The means of conveyance is a chemically inert, flexible, "printed" circuit with conductors sandwiched between corrosion resistant, insulating films. Termination of the circuit conductors to connectors, sensors or actuators utilizes buried contacts which enables encapsulation of the junctions and isolation of the conductors from surface shunting resistances due to surface contamination or conduction in the corrosive media.

Welded "buried" contacts are formed by applying force from resistance welder electrodes to the flexible circuit and the feedthrough connectors tapered tip contact pins, which tip pierces the flexible circuit insulation and allows contact with the buried conductor. A current discharge welds the pin to the conductor. Heat from the resistance weld promotes bonding of the insulating film to a conformal insulation covering the pin, and forms a gas tight seal at the electrical joint. Other buried contacts can be formed by attachment of exposed, flexible, conductor fingers to sensor bonding pads or contact surfaces and encapsulating the joint by coating the exposed surfaces with a conformal insulating film. This conformal coating can be formed by heating a cover film and vacuum forming it around the joint or coating with insulation material dispersed in a fluid and heat curing it to the point of thermoplastic flow, or by molding insulating material around the contact with a thermoplastic insulation in a fluid state.

System performance requirements which are met by this invention include reliable operation, long service life, and protecting the corrosive gases and fluids from contamination or particulate products resulting from the breakdown or material shedding of the interconnect materials. Further requirements met include electrical isolation of the conductors from the flowing medium to prevent current flow between conductors caused by electrical conductivity through the fluid or conduction through contaminants deposited on the exterior surface of the interconnect system. The invention also provides for interconnect flexibility to allow easy fabrication, installation, servicing, and use between elements which move during their normal operation.

BRIEF DESCRIPTION OF THE DRAWING

FIG. 9 is a detail partial cross sectional view of FIG. 8 after pin encapsulation.

FIG. 10 is a detail partial cross sectional view of a feedthrough pin and corrosion resistant flexible circuit portion just prior to welding.

FIG. 11 is a schematic view showing welding of the pin-to-flexible circuit connection.

FIG. 12 is a detail partial cross-sectional view of the connection after welding.

FIG. 13 is a detail partial cross-sectional view after encapsulation of the connection at the weld.

FIG. 14 is a partial cross-sectional view of the interconnect system in its mode of operation in a mass flow meter assembly.

DETAILED DESCRIPTION

Figure 1:
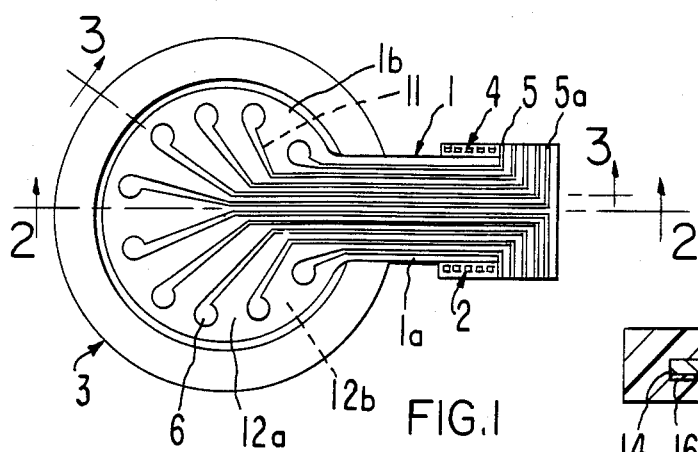
FIG. 1 is a plan view of the system showing attachment of the flexible interconnect circuit between a feedthrough connector passing through a portion of a flow sensor housing.

FIG. 1 illustrates the preferred embodiment of the invention in which a flexible, corrosion resistant interconnect circuit 1 provides electrical interconnection between a sensor chip 2 and feedthrough connector 3. Sensor bonding pads 4 are metallurgically bonded to exposed conductors 5a projecting from flexible circuit 1 at bond areas 5. Feedthrough connector pins 8 (FIG. 2) are spot welded at 6 to "Buried" conductors 11 inside the flexible circuits insulation. The tail 1a of interconnect circuit 1 is placed over the sensor chip top in a straddling position. Conductors 11 extend beyond the flexible insulation, forming exposed fingers 5a which are bonded to sensor bonding pads 4. The individual fingers are pre-formed to the straddle shape shown prior to placement over the sensor. This pre-formed straddle shape serves to position the contact fingers 5a directly over and in line with corresponding sensor contact pads.

Figure 3:
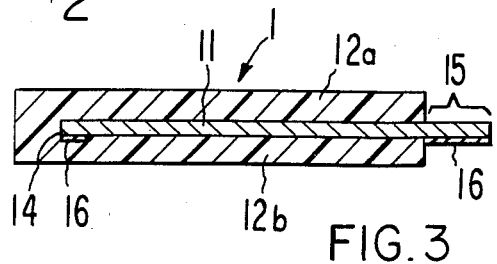
FIG. 3 is a cross sectional view of the flexible circuit per se taken on the line 3—3 of FIG. 1.
Figure 2:
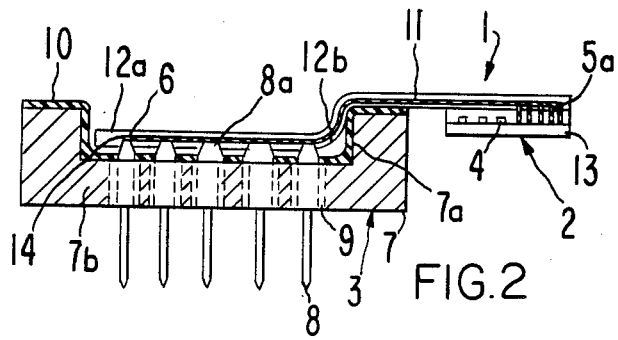
FIG. 2 is a side view of the system taken on the line 2—2 of FIG. 1.

As shown in FIG. 2, feedthrough connector 3 comprises a stainless steel body 7 having a circular depression 7a therein. Electrical connector chip input/output pins 8 extend through base wall 7b and are sealed in base 7b by insulating sealing glass 9. A conformal insulating film 10 of about 3 mils thickness and preferably of FEP Teflon material is provided. Flexible circuit conductors 11 are spot welded as at 6 where the flexible circuit insulation 12b and conformal insulation 10 has been pierced by the tips 8a of the pins 8 and displaced to allow a welded "buried" contact. At the opposite end of flexible circuit 1, sensor pads 4 are metallurgically bonded at 13 to the exposed ends 5a of the flexible circuit. The exposed metal bonds are then encapsulated to "bury" the connection within a corrosion resistant, insulating film. The flexible interconnect circuit 1 comprises film layers 12a and 12b each typically of about 2–3 mils thickness and composed of a thermoplastic fluoroplastic such as, FEP Teflon or other similar corrosion resistant flexible films. The films are thermally bonded to both sides of a flexible corrosion resistant metal foil having a typical thickness of about 1 mil and made from a conductive material such as nickel or stainless steel. The foil is patterned, etched, or otherwise formed into the required conductor paths, resulting in a flexible "printed" interconnecting circuit. The metal foil conductors may be terminated within the insulating films 12a, 12b or extend exteriorly as at 15 (FIG. 3). The conductor ends may be stripe plated with gold or other corrosion resistant metals as at 16 (FIG. 3) to improve corrosion resistance and to provide a malleable surface suitable for ultrasonic or thermocompression bonding to the pins 8 and the bonding pads 5.

FIG. 3 illustrates the upper and lower insulating films 12a and 12b which are conformally coated around and bonded to conductor film 11. The conductors are normally terminated within the insulating films as at 14 to allow "buried" electrical connections to pins 8 and extend outwardly at 15 to connect with the chip bonding pads.

Figure 4:
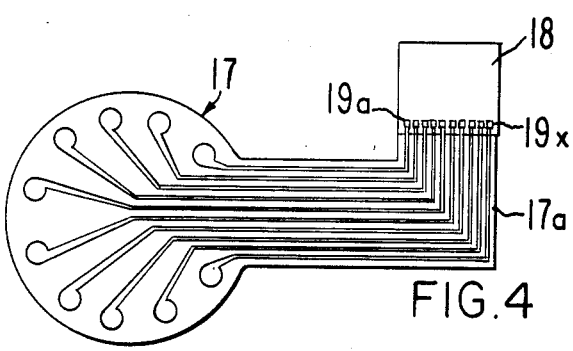
FIG. 4 is a plan view of another embodiment showing the flexible circuit bonded to a sensor chip.

FIG. 4 shows an embodiment where the flexible interconnect circuit has a tail 17a with foil ends connecting to a single row of bonding pads 19a through 19x on an edge of sensor chip 18.

Figure 5:
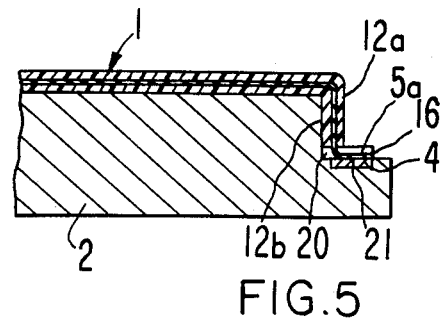
FIG. 5 is a detail cross sectional end view of the sensor chip taken from the right side of FIG. 1 prior to encapsulation.

FIG. 5 shows a flexible circuit 1 straddle mounted on top of sensor chip 2. Exposed bonding conductor fingers 5a with a suitable metal plated surface 16, exit insulating films 12a and 12b at locations 20 and are bonded to the sensor bonding pads 4 to form connections 21, using methods such as conventional semiconductor gold-gold bonding techniques, utilizing an ultrasonic, thermocompression, or thermalsonic bonder.

Figure 6:
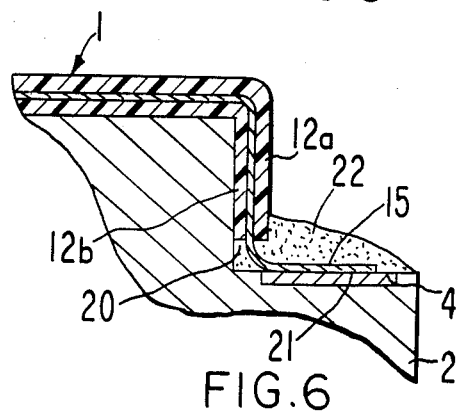
FIG. 6 is the same as FIG. 5 after encapsulation.

FIG. 6 shows the same cross-sectional view of the sensor-interconnect bond, but after the application of an insulating passivation film 22. After bonding, all exposed metallization of the interconnect foil and sensor is coated with a thermoplastic fluoroplastic inert film such as FEP Teflon plastic in a liquid dispersion form. This coating is cured by heating the sensor substrate to 330° C. (625° F.) for 30 minutes. The resulting conformal pin-hole free insulating film 22 serves to electrically isolate and insulate the bond areas while also protecting them from corrosion.

An alternative technique for bond passivation is one which uses a vacuum-formed Teflon plastic pouch. After electrical bonding, the sensor/flexible circuit combination is inserted into the Teflon pouch and the assembly is heated to 300° C. (572° F.) with vacuum evacuation of the pouch. At this temperature, the pouch shrinks to conformally coat the sensor and bond areas, effectively insulating electrically and providing protection from corrosion. Plastic deformation and flow of the Teflon pouch occurs, as well as bonding of the film to the sensor and conductor surfaces.

Figure 7:
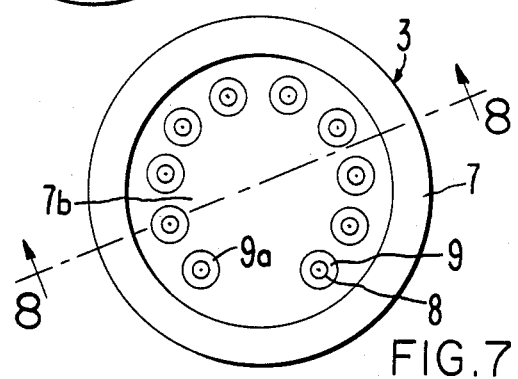
FIG. 7 is a plan view of a feedthrough connector prior to connection with the flexible circuit.

FIG. 7 shows the connector 3 prior to overlay of the circular flexible circuit portion 1b (FIG. 1). The stainless steel body 7 contains conductive feedthrough, typically Kovar metal, pins 8 which pass through apertures 9a in wall 7b and are electrically insulated by a glass insulator 9. Pins 8 may be plated with a corrosion resistant metal such as gold or platinum to provide additional corrosion protection for the pins.

Figure 8:
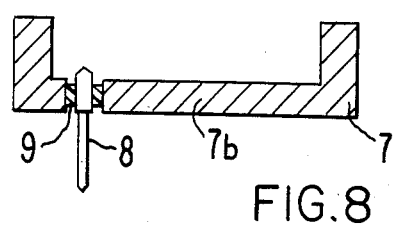
FIG. 8 is a cross sectional view of FIG. 7 taken on the line 8—8 showing a conical tapered feedthrough pin.

FIG. 8 illustrates the position of one of the multiple feedthrough pins 8 in body 7 and its insulation from body 7 by glass insulation 9.

FIG. 9 is similar to FIG. 8 but with a conformal insulating film 10 applied to all surfaces of the feedthrough connector 3 exposed to the gas within circular depression 7a. Connector 3 in typical usage is seen in FIG. 9 of related application Ser. No. 06/721,535 as element 90. Corrosion protection and electrical isolation of the feedthrough is achieved by coating the exposed feedthrough connector surfaces and pins with a film or liquid dispersion containing insulating film materials such as Teflon polymer. Bonding the film to the exposed surfaces must be done at high enough temperatures 600° F.–750° F. to allow thermoplastic flow to provide the desired conformal pinhole-free film.

FIG. 10 shows the alignment of the flexible circuit 1 over a feedthrough pin 8 prior to welding. The flexible circuit containing buried conductor 11 or pattern portion 6 is centered and aligned over conical point 23 of pin 8. The transparent nature of insulating films 12a and 12b allow visual registration or alignment. By formation of the ends of the feedthrough pins to a relatively sharp conical point 23, controlled piercing of the flexible circuit insulation is possible to interconnect the pin to the conductor buried within the insulating films.

FIG. 11 shows the formation of a buried spot weld 24 at the contact point of the flexible interconnect circuit 1 portion and the conical point 23 of the insulated feedthrough pin 8 by applying a press force between spot welding electrodes 25 and 26. The weld is achieved by the welding electrodes electrically contacting the exterior uninsulated portion 27 of the feedthrough pin 8 and providing a current pulse from a welding supply 28 to spot welding electrodes 25 and 26. The thinness of the film 12a permits meeting of the film at the interface with electrode 25 and current flow between the electrodes. An electrically conductive weld 24 between the conical point 23 of pin 8 and foil conductor end 14 at portion 6 is achieved while maintaining a continuous insulating film over all areas of the junction except a small area over the joint where the spot welding electrode 25 displaces the top insulating layer 12a. The heat generated by the weld causes thermoplastic fusion of both the insulating films 12a,12b near the weld point when the electrodes are energized. Excessive heat at the weld can cause gas generation and entrapment with the appearance of a bubble or blister in the insulating film. Selection of the appropriate electrode shape, electrode materials, weld current, weld duration and electrode press force allows achievement of welds without gas generation.

FIG. 12 shows the pin-to-flexible circuit weld joint 24 after welding where buried conductor end 14 is exposed at location 28a where the upper welding electrode 25 displaced the upper film 12a.

FIG. 13 shows the exposed area 28a after encapsulation with an inert insulating film 29. Encapsulation of the exposed weld joint can be achieved using thermoplastic fluoroplastic film or liquid dispersion solution with thermal bonding and curing using a heated probe, a jet of heated air, or radiant heating. An alternative is to use ultrasonic welding of the insulating film to encapsulate the exposed weld.

FIG. 14 illustrates the assembly of connector 3 into the open end of a mass flow meter housing 30. Chip 18, as described in the related applications, has flow passages 36 therein and contact pads 4 at outer edge portions for inputting and outputting sensor electrical energy and signals. Chip 18 may be mounted by a circular open spider 31 or other means having flow passages 32 therein for the gas being measured. Gas flow is shown by arrows 34, 34a coming into chip passages 36 and by arrows 35 coming out of the chip passages. Interconnect circuit 1 has metallization portions 5 connected to chip pads 4. The conformal coating 10 is clearly shown protecting the pin and pad connections to the flexible circuit. An O-ring seal 33 seals connector 3 in the housing 30. Applications to other types of sensors, actuators, and electrical apparatus which must operate in a corrosive, contaminated or high purity environment are contemplated.

The above description of embodiments of this invention is intended to be illustrative and not limiting. Other embodiments of this invention will be obvious to those skilled in the art in view of the above disclosure.

We claim:

1. A corrosion resistant interconnect system comprising:
   a corrosion resistant metal conductor pattern bonded between at least two thermoplastic corrosion resistant insulating film layers, a feed-through connector including a series of insulated metal pins, means on said pins for piercing through one of said insulating film layers to contact said corrosion resistant metal conductor pattern, means for joining said metal pins to said metal conductor pattern and means for maintaining gas tight conformal integrity of the insulating film layers.

2. The corrosion resistant interconnection system of claim 1 further comprising:
   an encapsulating layer extending over the insulating film layers in areas where said one insulating film layer has been pierced.

3. The interconnect system of claim 1 where the insulating film layers are thermoplastic fluoropolymers.

4. The interconnect system of claim 1 where the corrosion resistant metal conductor pattern is selected from the class consisting of nickel, stainless steel, a refractory metal and a noble metal.

5. The interconnect system of claim 1 further comprising:
   a plated metal film on at least a portion of said metal conductor pattern to improve the corrosion resistance and permit thermocompression and ultrasonic bonding.

6. The interconnect system of claim 5 in which said plated metal film comprises a gold plate.

7. The interconnect system of claim 1 further comprising:
   exposed metal conductors extending from said metal conductor pattern and exiting from between said insulating film layers for electrical contact bonding to a sensor chip bond pad.

8. The interconnect system of claim 7 further comprising:
   a plated metal film on said exposed metal conductors to improve corrosion resistance and enable thermocompression and ultrasonic bonding.

9. The interconnect system of claim 7 further comprising:
   an insulating conformal film of a corrosion resistant thermoplastic thermally bonded over all exposed surfaces of the exposed metal conductors.

10. A chip-to-inlet/outlet pins interconnect system comprising:
    a first insulating film, a metallization pattern having discrete conductive paths on said first film, a second insulating film bonded to said metallization pattern and said first film, said first and second films and said metallization pattern forming a flexible circuit substrate;
    a feed-through connector having a base wall and multiple pins insulatively mounted in and through said base wall;
    said flexible circuit substrate being in contact with said base wall such that portions of said metallization pattern are aligned with said multiple pins;
    means on first ends of said pins facing said substrate for piercing said first film and bringing said pins first ends into contact with said portions of said metallization pattern;
    said pin first ends and said portions of said metallization pattern being bonded to form an electrical connection;
    an integrated circuit chip; and
    means to attach other portions of said metallization pattern to said chip.

11. The interconnect system of claim 10 further comprising an encapsulating layer extending adjacent the first insulating film for sealing an area of said first insulating film adjacent to the contact of said pin first ends with said metallization pattern.

12. In combination, a mass flow meter chip having contact pads thereon;
    a mass flow meter housing having an open end;
    means for mounting said chip in said mass flow meter housing;
    a feed-through connector having a base wall and multiple inlet/outlet pins insulatively mounted in and through said base wall, said connector closing said housing open-end;
    an interconnect system comprising a first insulating film, a second insulating film and a metallization pattern bonded between said films, said interconnect system being in contact with a surface of said base wall facing said chip and having portions of said metallization pattern in alignment with first ends of said pins;
    means on said first ends of said pins for piercing said first insulating film for bringing said pins into contact with said metallization pattern portions; and
    means on other portions of said metallization pattern for connecting said pattern to said contact pads on said chip.

13. A method of making a chip-to-inlet/outlet pins interconnection comprising:
    insulatingly mounting multiple inlet/outlet pins in a holder, said pins having sharp end portions;

placing a flexible circuit having buried conductor patterns encased in an insulative film adjacent said end portions;

placing welding electrodes against said pins and said circuit in alignment with portions of said patterns to pierce and heat weld said pins to said portions; and coating said circuit with an insulative, corrosion resistant coating in those areas where electrical contacts are made in said flexible circuit.

* * * * *